US010249574B2

(12) United States Patent
Ling

(10) Patent No.: US 10,249,574 B2
(45) Date of Patent: Apr. 2, 2019

(54) METHOD FOR MANUFACTURING A SEAL RING STRUCTURE TO AVOID DELAMINATION DEFECT

(71) Applicant: SEMICONDUCTOR MANUFACTURING INTERNATIONAL (SHANGHAI) CORPORATION, Shanghai (CN)

(72) Inventor: Long Ling, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 23 days.

(21) Appl. No.: 15/650,687

(22) Filed: Jul. 14, 2017

(65) Prior Publication Data

US 2017/0317037 A1    Nov. 2, 2017

Related U.S. Application Data

(62) Division of application No. 15/157,318, filed on May 17, 2016, now Pat. No. 9,735,116.

(30) Foreign Application Priority Data

May 19, 2015  (CN) .......................... 2015 1 0255840

(51) Int. Cl.
| H01L 23/00 | (2006.01) |
| H01L 21/78 | (2006.01) |
| H01L 21/76 | (2006.01) |
| H01L 23/532 | (2006.01) |
| H01L 21/768 | (2006.01) |
| H01L 23/58 | (2006.01) |

(52) U.S. Cl.
CPC ...... *H01L 23/562* (2013.01); *H01L 21/76847* (2013.01); *H01L 21/78* (2013.01); *H01L 23/53238* (2013.01); *H01L 23/585* (2013.01)

(58) Field of Classification Search
CPC .............. H01L 21/76847; H01L 21/78; H01L 23/53238; H01L 23/562; H01L 23/585
See application file for complete search history.

(56) References Cited

U.S. PATENT DOCUMENTS

| 2008/0191205 A1 | 8/2008 | Tsai et al. |
| 2009/0108409 A1* | 4/2009 | Tsutsue .................. H01L 21/768 257/618 |
| 2016/0343673 A1 | 11/2016 | Ling |

OTHER PUBLICATIONS

U.S. Appl. No. 15/157,318 , "Notice of Allowance", dated Apr. 13, 2017, 8 pages.
U.S. Appl. No. 15/157,318 , "Restriction Requirement", dated Dec. 27, 2016, 5 pages.

* cited by examiner

*Primary Examiner* — Thanhha S Pham
(74) *Attorney, Agent, or Firm* — Kilpatrick Townsend & Stockton LLP

(57) ABSTRACT

A method for manufacturing a semiconductor device includes providing a semiconductor substrate, forming a plurality of integrated circuit (IC) devices on the semiconductor substrate, and forming a seal ring structure surrounding each of the IC devices. Forming the seal ring structure includes forming a plurality of interlayer dielectric layers on the semiconductor substrate, and forming a plurality of hollow through-hole structures within each of the interlayer dielectric layers.

13 Claims, 2 Drawing Sheets

METHOD FOR MANUFACTURING A SEAL RING STRUCTURE TO AVOID DELAMINATION DEFECT

CROSS-REFERENCES TO RELATED APPLICATIONS

This application is divisional application of U.S. application Ser. No. 15/157,318, entitled "New Seal Ring Structure to Avoid Delamination Defect", filed on May 17, 2016, which claims priority to Chinese patent application No. 201510255840.7, filed May 19, 2015, both of which are incorporated herein by reference in their entirety.

FIELD OF INVENTION

The present invention relates to semiconductor technology, and more particularly to a semiconductor device and manufacturing method thereof.

BACKGROUND OF THE INVENTION

In the manufacture of microelectronic devices, integrated circuits are formed on a semiconductor substrate, which generally includes silicon or other materials such as gallium arsenide, and a plurality of interconnect layers such as copper layers, aluminum layers, and the like. With the development of semiconductor technology and integrated circuits, semiconductor technology continues to advance to smaller technology nodes, a semiconductor substrate may include an increased number of integrated circuits. The processed semiconductor substrate is then cut into a number of finished integrated circuits that can be individually packaged.

However, with the continuous shrinking of the size of the semiconductor devices, in processing semiconductor devices with technology nodes of 40 nm and below, the finished products after the laser grooving and diamond cutting processes suffer cracking, peeling, and delamination defects.

Two methods are currently available to solve delamination problems: the first one is to form an opening in the top layer of the passivation layer in the scribe line region; and the second one is to reduce the size of the test pad and copper metal layer in the scribe line to avoid stress due to laser cutting. However, the conventional methods cannot prevent delamination from occurring.

FIG. 1 is a cross-sectional view of a semiconductor device containing a sealing ring, as known in the prior art. A semiconductor device (alternatively referred to as integrated circuit or chip) 10 includes semiconductor substrate 100, a chip edge 110, a cutting region disposed at an outer periphery of the semiconductor device, and a seal ring 120 disposed between the cutting region and a chip region to effectively prevent cracking and peeling in the chip caused by dicing of the semiconductor substrate. The seal ring is formed in the metal layer and the dielectric layer of a semiconductor substrate. The seal ring may be a stacked structure of several metal layers connected together through the through-holes (vias) in the interlayer dielectric layers or other mechanical stress buffering structures.

Delamination occurs because stress is generated when a metal pad is cut during the laser scribing process, the stress is released after transmitting to the chip. Conventional seal rings cannot stop delamination, low dielectric constant materials are used in next-generation semiconductor processes, which greatly reduce the fracture toughness and adhesion between the layers made of different materials, thus expanding the range of the delamination and cracking in the dielectric layers. Delamination and cracking are generally generated at the edge of the chip and extend to the middle of the chip, adversely affecting the functional integrity and yield of the chip.

Thus, there is a need to provide a new semiconductor device that overcomes the disadvantages associated with prior art.

BRIEF SUMMARY OF THE INVENTION

Embodiments of the present invention provide a method for manufacturing a semiconductor device and an apparatus including the semiconductor device.

According to one embodiment of the present invention, a semiconductor device includes a semiconductor substrate, a plurality of integrated circuit devices formed on the semiconductor substrate, and a seal ring structure surrounding each one of the integrated circuit devices. The seal ring structure includes a plurality of interlayer dielectric layers and a plurality of hollow through-hole structures disposed within each of the interlayer dielectric layers.

In one embodiment, each hollow through-hole structure includes a through-hole disposed within one of the interlayer dielectric layers, a diffusion barrier layer and a seed layer sequentially disposed in this order at the bottom portion and sidewalls of the through-hole and sealing an opening at the top portion of the through-hole.

In one embodiment, the sum of the thickness of the diffusion barrier layer and the thickness of the seed layer is less than the radius of the through-hole.

In one embodiment, the diffusion barrier layer includes at least one material selected from the group consisting of tantalum, tantalum nitride, titanium, titanium nitride, zirconium nitride, titanium zirconium nitride, tungsten, tungsten nitride, an alloy thereof, and a compound thereof. The seed layer is a copper seed layer.

In one embodiment, the through-hole structure includes a critical dimension less than 45 nm.

In one embodiment, the interlayer dielectric layers include a low-k material.

In one embodiment, the seal ring structure includes a multi-layer metal interconnect structure disposed on opposite sides of the seal ring structure, and a test pad disposed on the metal interconnect structure.

Embodiments of the present invention provide a method for manufacturing a semiconductor device. The method includes providing a semiconductor substrate, forming a plurality of integrated circuit (IC) devices on the semiconductor substrate, and forming a seal ring structure surrounding each of the IC devices. The seal ring structure may be formed using the following steps: forming a plurality of interlayer dielectric layers on the semiconductor substrate, and forming a plurality of hollow through-hole structures within each of the interlayer dielectric layers.

In one embodiment, the method further includes forming a cutting channel at an outer periphery of the seal ring structure in the semiconductor substrate, and cutting the semiconductor substrate along the cutting channel.

In one embodiment, forming the plurality of hollow through-hole structures within an interlayer dielectric layer includes performing an etching process on the interlayer dielectric layer at a location of the cutting channel to form the through-holes, sequentially forming a diffusion barrier layer and a seed layer at a bottom portion and sidewalls of the through-holes. The diffusion barrier layer and the seed layer seal an opening at a top portion of the through-holes to form the hollow through-hole structures.

In one embodiment, a through-hole structure comprises a critical dimension less than 45 nm.

Embodiments of the present invention also provide an electronic apparatus including a semiconductor device. The semiconductor device includes a semiconductor substrate, a plurality of integrated circuit devices on the semiconductor substrate, and a seal ring structure surrounding each one of the integrated circuit devices. The seal ring structure includes a plurality of interlayer dielectric layers and a plurality of hollow through-hole structures disposed within each of the interlayer dielectric layers.

In one embodiment, the hollow through-hole structure includes a through-hole disposed within one of the interlayer dielectric layers, a diffusion barrier layer formed at a bottom and sidewalls and a top of the through-hole, and a seed layer disposed on the diffusion barrier layer.

In accordance with the present invention, the seal ring structure can effectively buffer the stress generated by cutting the semiconductor substrate to protect the integrated circuit devices from lamination defects caused at the time of die cutting of the semiconductor substrate, thereby improving the yield and performance of the semiconductor device.

The following description, together with the accompanying drawings, will provide a better understanding of the nature and advantages of the claimed invention.

DETAILED DESCRIPTION OF THE INVENTION

Figure 1:
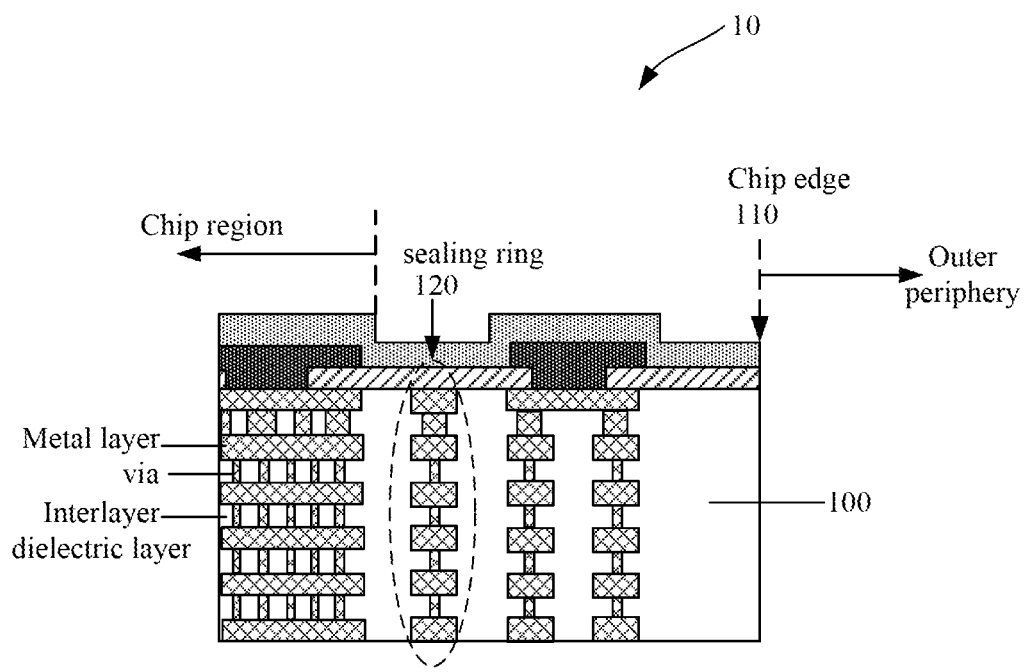
FIG. 1 is a cross-sectional view of a semiconductor device including a seal ring, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an", and "the" may include singular and plural references. It will be further understood that the terms "comprising", "including," having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place, Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

Figure 2:
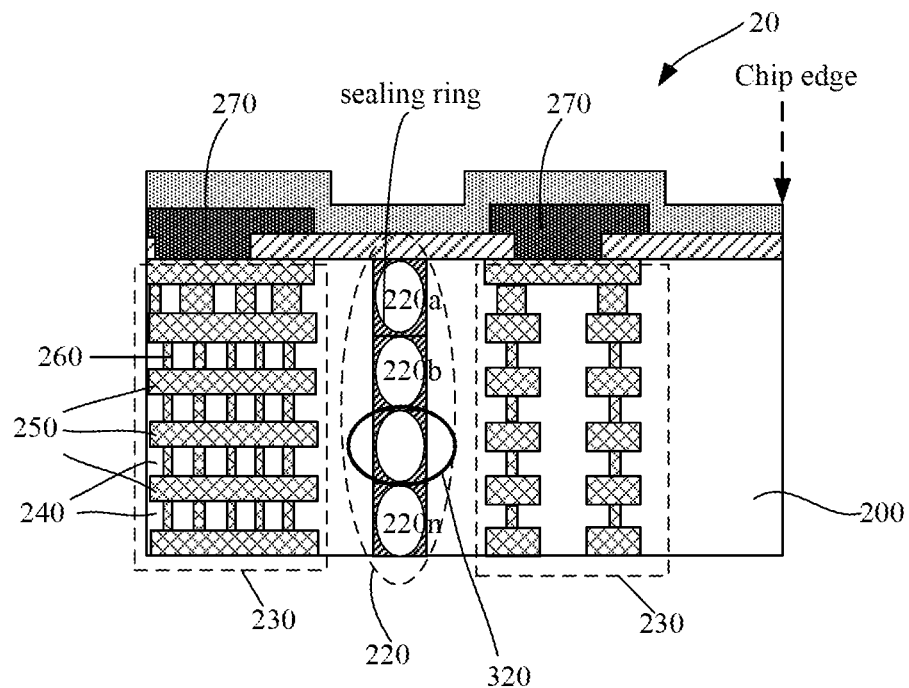
FIG. 2 is a cross-sectional view of a semiconductor device including a seal ring structure according to embodiments of the present invention.

FIG. 2 is a cross-sectional view of a semiconductor device including a seal ring structure according to one embodiment of the present invention. Referring to FIG. 2, a semiconductor device (alternatively referred to as chip or integrated circuit device) 20 includes a semiconductor substrate 200. The semiconductor substrate may be made of silicon, silicon-on-insulator (SOI), strained silicon-on-insulator (SSOI), strained silicon germanium on insulator (S—SiGeOI), silicon germanium on insulator (SiGeOI), germanium on insulator (GeOI) and the like.

The semiconductor device 20 may also include multiple chips (not shown) on the semiconductor substrate. Each chip may include a complete integrated circuit structure, the integrated circuit is provided in the active region of the semiconductor substrate. In the semiconductor manufacturing processes, a dicing process is performed to cut the semiconductor substrate into multiple fully functional integrated circuit devices. The dicing process may include a laser scribing, diamond cutting process, or other processes. Stress generated in the cutting process may cause damage to elements or components of the integrated circuit devices, such as wires, transistors, resistors, capacitors, and the like. The stress may cause delamination in the integrated circuit devices.

The semiconductor device may also include a seal ring that comprises multiple interlayer dielectric layers and a number of hollow through-hole structures disposed in each the interlayer dielectric layers. In an exemplary embodiment, a hollow through-hole structure includes a through-hole (alternatively referred to as via) formed in each interlayer dielectric layer, and diffusion barrier layer and seed layer sequentially formed at the bottom and sidewalls of the through-hole. The sum of the thickness of the diffusion barrier layer and the thickness of the seed layer is less than the radius of the through-hole to ensure that the through-hole structure is hollow. The region corresponding to the seal ring includes a number of stacked through-hole structures, the number of the stacked through-hole structures is determined according to actual requirements. For example, each interlayer dielectric layer may include one or more rows of the hollow through-hole structures to form a complete seal ring structure. The through-hole structure has a relatively small size, the critical dimension of the through-hole structure is less than 45 nm, preferably less than 40 nm. The critical dimension of the through-hole structure is not limited to the above size, embodiments of the present invention may apply to other technology nodes.

In some embodiments, the interlayer dielectric layer is preferably made of a low-k dielectric material, such as fluorinated silicate glass (FSG), silicon oxide, a carbon-containing material, porous material, and the like.

The diffusion barrier layer may be tantalum, tantalum nitride, titanium, titanium nitride, zirconium nitride, titanium-zirconium nitride, tungsten, tungsten nitride, and an alloy thereof or a compound thereof. In addition, the diffusion barrier layer may be a multi-layered structure. The diffusion barrier layer may be formed using physical vapor deposition (PVD), atomic layer deposition (ALD), spin-on coating, or other suitable deposition processes. The seed layer may be a metal material. Generally, the seed layer is a copper seed layer. The seed layer may be formed using a physical vapor deposition, atomic layer deposition, and other suitable deposition processes.

The seal ring is disposed around the edge of the semiconductor device, i.e., surrounding the integrated circuit or chip, to provide protection against stress. The seal ring is disposed between the scribe line and the semiconductor device to insulate the external environment-related stress.

In an exemplary embodiment, a multilayer metal interconnect structure is formed on opposite sides of the seal ring, and a test pad is formed on the metal interconnect structure.

Referring to FIG. 2, the semiconductor device 20 includes a semiconductor substrate 200, a plurality of integrated circuit devices (not shown) on the semiconductor substrate, a seal ring structure 220 surrounding each one of the integrated circuits. The semiconductor substrate 200 also includes a plurality of interlayer dielectric layers 240, and a multi-layer metal interconnect structure 230 disposed on opposite sides of the seal ring structure. The multi-layer metal interconnect structure 230 includes a plurality of interconnect metal layers 250 interposed between each of the interlayer dielectric layers 240. The interconnect metal layers 250 are connected with each other through a plurality of vias 260. The seal ring structure 220 includes a plurality of hollow through-hole structures 220a, 220b, . . . , 220n. The semiconductor substrate 200 also includes a test pad 270 disposed on the multi-layer metal interconnect structure 230.

Figure 3:
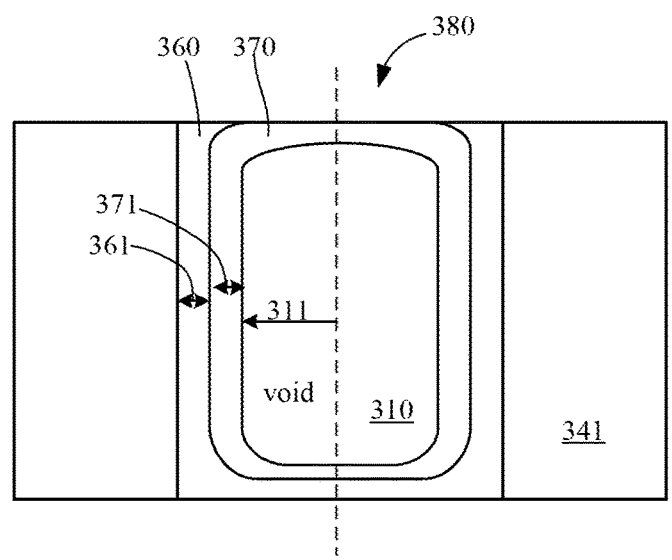
FIG. 3 is a cross-sectional view of an enlarged portion of a hollow through-hole structure of the seal ring structure of FIG. 2.

FIG. 3 is a cross-sectional view of an enlarged portion of a hollow through-hole structure 320 of the seal ring structure of FIG. 2. As shown in FIG. 3, the hollow through-hole structure includes a through hole 310 disposed within an interlayer dielectric layer 341. A diffusion barrier layer 360 is disposed on the bottom portion and sidewalls of the through hole 310. A seed layer 370 is disposed on the diffusion barrier layer 360. The diffusion barrier layer and the seed layer seal (cover) the opening 380 of the top portion of the though-hole 310. The diffusion barrier layer 360 has a thickness 361, and the seed layer 370 has a thickness 371. The sum of the thickness 361 of the diffusion barrier layer 360 and the thickness 371 of the seed layer 370 is less than the radius 311 of the through hole 310. It will be appreciated that although only one hollow through-hole structure is shown within interlayer dielectric layer 341, it is understood that one or more rows of hollow through-hole structures may be formed within an interlayer dielectric layer.

Figure 4:
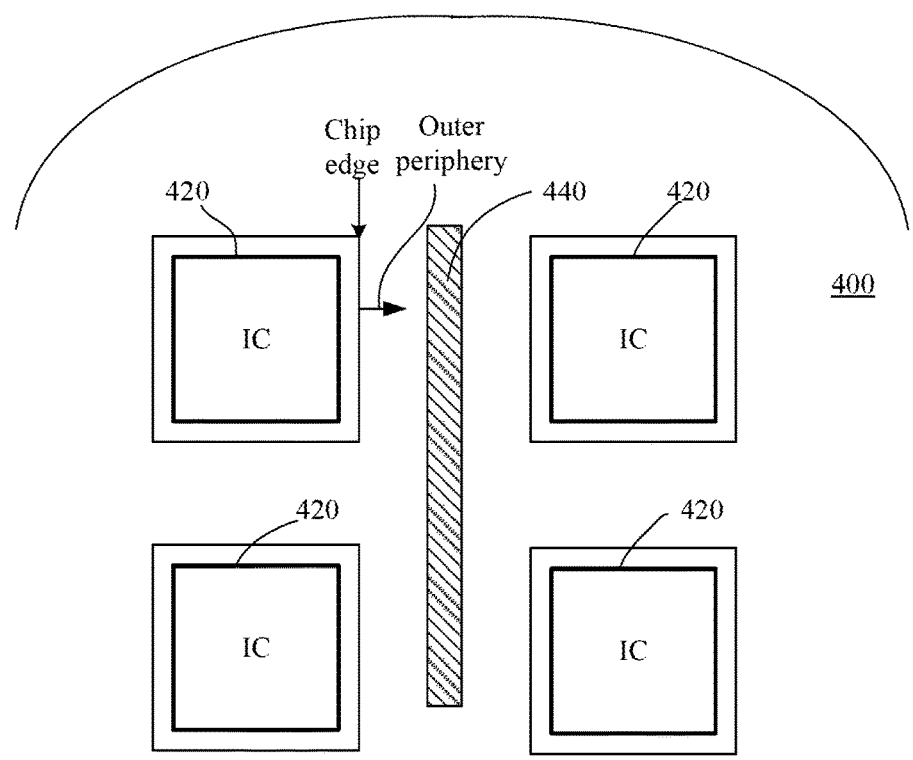
FIG. 4 is a top plan view of a semiconductor device according to an embodiment of the present invention.

FIG. 4 is a top view of a semiconductor device according to an embodiment of the present invention. As shown in FIG. 4, a semiconductor substrate 400 includes a plurality of integrated circuit (IC) devices disposed thereon. A seal ring structure 420 surrounds each of the IC devices. A cutting channel 440 is formed at the outer periphery of the seal ring structure.

In summary, in accordance with the present invention, the semiconductor device comprises a seal ring that includes a plurality of hollow through-hole structures. The seal ring can serve as a buffer to reduce stress generated due to the cutting process. The seal ring can effectively reduce or eliminate lamination and cracking, thereby improving the performance and yield of the semiconductor device.

Second Embodiment

Embodiments of the present invention also provide a method for manufacturing a semiconductor device. The method may include:

at A1: providing a semiconductor substrate, and forming one or more integrated circuit devices (semiconductor devices, ICs, or chips) on the semiconductor substrate. The semiconductor substrate may be made of silicon, silicon-on-insulator (SOI), strained silicon-on-insulator (SSOI), strained silicon germanium on insulator (S-SiGeOI), silicon germanium on insulator (SiGeOI), germanium on insulator (GeOI) and the like.

Each of the integrated circuit devices includes a complete integrated circuit structure (including transistors, capacitors, resistors, diodes, etc.) disposed in an active region of the semiconductor substrate.

at A2: forming a seal ring structure (alternatively referred to as seal ring) surrounding each of the integrated circuit devices (chips). The seal ring structure includes multiple interlayer dielectric layers and hollow through-hole structures formed within each of the interlayer dielectric layers.

The interlayer dielectric layer is preferably made of a low-k dielectric material, such as fluorinated silicate glass (FSG), silicon oxide, a carbon-containing material, porous material, and the like.

In an exemplary embodiment, the hollow through-hole structure may be formed using the following steps: separately etching each of the interlayer dielectric layers deposited in the scribe channel to form a plurality of through-holes, sequentially depositing a diffusion barrier layer and a seed layer on sidewalls and the bottom portion of the through-hole. The diffusion barrier layer and the seed layer seal (cover) the opening at the top portion of the through-hole to form the hollow through-hole structure. In a specific embodiment, the through-hole has a critical dimension less than 45 nm, preferably less than 40 nm. Furthermore, the aspect ratio of the through-hole is controlled to be larger than a predetermined value in order to reduce the capability of filling in the through-hole of the diffusion barrier layer and the seed layer, so that the diffusion barrier layer and the seed layer can seal the opening at the portion of the through-hole. The predetermined value of the aspect ratio may be different for different technology nodes. Thus, the appropriate aspect ratio is chosen based on the required technology node. The aspect ratio of the through-hole can be selected such way that the diffusion barrier and seed layer can reliably seal the opening at the top portion of the through-hole.

Furthermore, at a proper aspect ratio of the through-hole, since the critical dimension of the through-hole is relatively small, in the deposition process the diffusion barrier layer and seed layer can easily gather in the through-hole and completely seal the through-hole.

The diffusion barrier layer may be a silicon-containing layer, a carbon-containing layer, a nitrogen-containing layer, a hydrogen-containing layer, or a metal compound layer. A metal or metal compound layer may be made of tantalum, tantalum nitride, titanium, titanium nitride, zirconium nitride, titanium-zirconium nitride, tungsten, tungsten nitride, an alloy thereof, or a compound thereof. The diffusion barrier layer may be formed by a physical vapor deposition, an atomic layer deposition, a spin-on coating or other suitable processes. The diffusion barrier layer may be formed at a temperature of about 40° C. to about 400° C., and under a pressure in the range between about 0.1 milli-Torr (mTorr) and 100 mTorr. Furthermore, the diffusion barrier layer may also include multiple layers.

The seed layer may be a metal material. Generally, the seed layer is a copper seed layer. The seed layer may be formed by a physical vapor deposition, atomic layer deposition, and other suitable deposition processes. Throughout the manufacturing processes, the thickness of the diffusion barrier layer and the thickness of the seed layer may be controlled such that the thickness of each layer is smaller than the radius of the through-hole to ensure that a void is formed inside the through-hole.

In an embodiment, a scribe channel is formed on the external side of the seal ring structure. The method also includes, after forming the seal ring structure, dicing the semiconductor substrate along the scribe or cutting channel.

In semiconductor processes, there is a need to dice the semiconductor substrate to obtain fully functional integrated circuit devices. The dicing process may be a laser grooving process, a diamond cutting process, and other cutting processes. Since the seal ring includes multiple hollow through-hole structures, the seal ring provides a cushion to effectively prevent delamination caused by stress generated during the cutting process.

Thus, the method for manufacturing a semiconductor device according to embodiments of the present invention can effectively prevent stress generated during the cutting process, thereby improving the yield and performance of the semiconductor device.

Third Embodiment

Embodiments of the present invention provide an electronic device including an electronic component and a semiconductor device connected to the electronic component. The semiconductor device can be the semiconductor device of embodiment 1 or manufactured by the above-described method of embodiment 2.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve RF performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features.

As such, the foregoing description should be considered as merely illustrative of the principles of the invention, and not in limitation thereof.

What is claimed is:

1. A method for manufacturing a semiconductor device, the method comprising:
   providing a semiconductor substrate;
   forming a plurality of integrated circuit (IC) devices on the semiconductor substrate; and
   forming a seal ring structure surrounding each of the IC devices, wherein forming the seal ring structure comprises:
   forming a plurality of interlayer dielectric layers on the semiconductor substrate; and
   forming a plurality of hollow through-hole structures within the interlayer dielectric layers, wherein forming a plurality of hollow through-hole structures within the interlayer dielectric layers comprises:
   performing an etching process on each of the interlayer dielectric layers at a location of a cutting channel in the semiconductor substrate to form one or more through-holes;
   sequentially forming a diffusion barrier layer and a seed layer at a bottom portion and sidewalls of the one or more through-holes, wherein the diffusion barrier layer and the seed layer seal an opening at a top portion of the one or more through-holes.

2. The method of claim 1,
   wherein the cutting channel is formed at an outer periphery of the seal ring structure in the semiconductor substrate; and the method further comprising:
   cutting the semiconductor substrate along the cutting channel.

3. The method of claim 1, wherein a through-hole structure comprises a critical dimension less than 45 nm.

4. The method of claim 1, wherein the diffusion barrier layer comprises at least one material selected from the group consisting of tantalum, tantalum nitride, titanium, titanium nitride, zirconium nitride, titanium zirconium nitride, tungsten, tungsten nitride, an alloy thereof, and a compound thereof.

5. The method of claim 1, wherein the seed layer is a copper seed layer.

6. The method of claim 1, wherein a sum of a thickness of the diffusion barrier layer and a thickness of the seed layer is less than a radius of a through-hole.

7. The method of claim 1, further comprising:
   forming a plurality of interconnect metal layers on opposite sides of the seal ring structure, wherein the interconnect metal layers are interposed between each of the interlayer dielectric layers.

8. The method of claim 7, wherein the interconnect metal layers are connected to each other through a plurality of vias.

9. The method of claim 1, wherein the semiconductor substrate comprises at least one material selected from the group consisting of silicon, silicon-on-insulator, strained silicon-on-insulator, strained silicon germanium on insulator, silicon germanium on insulator, and germanium on insulator.

10. The method of claim 1, wherein the interlayer dielectric layers each comprises a low-k dielectric material.

11. The method of claim 1, wherein the diffusion barrier layer is a silicon-containing layer, a carbon-containing layer, a nitrogen-containing layer, a hydrogen-containing layer, or a metal compound layer.

12. The method of claim 1, wherein forming the diffusion barrier layer is performed at a temperature in a range between 40 degrees C. and 400 degrees C., and under a pressure in a range between 0.1 mTorr and 100 mTorr.

13. The method of claim 1, wherein cutting the semiconductor substrate comprises a laser grooving process or a diamond cutting process.

* * * * *